US011956894B2

United States Patent
Van Der Wel

(10) Patent No.: US 11,956,894 B2
(45) Date of Patent: Apr. 9, 2024

(54) FLEXIBLE PRINTED CIRCUIT BOARD ASSEMBLY

(71) Applicant: SIGNIFY HOLDING B.V., Eindhoven (NL)

(72) Inventor: Pieter Joseph Clara Van Der Wel, Heerlen (NL)

(73) Assignee: SIGNIFY HOLDING, B.V., Eindhoven (NL)

( * ) Notice: Subject to any disclaimer, the term of this patent is extended or adjusted under 35 U.S.C. 154(b) by 332 days.

(21) Appl. No.: 17/432,741

(22) PCT Filed: Mar. 3, 2020

(86) PCT No.: PCT/EP2020/055540
§ 371 (c)(1),
(2) Date: Aug. 20, 2021

(87) PCT Pub. No.: WO2020/178279
PCT Pub. Date: Sep. 10, 2020

(65) Prior Publication Data
US 2022/0061152 A1 Feb. 24, 2022

(30) Foreign Application Priority Data
Mar. 5, 2019 (EP) ..................................... 19160784

(51) Int. Cl.
*H05K 1/02* (2006.01)
*H05K 1/03* (2006.01)
(Continued)

(52) U.S. Cl.
CPC ......... *H05K 1/0281* (2013.01); *H05K 1/0346* (2013.01); *H05K 1/189* (2013.01);
(Continued)

(58) Field of Classification Search
CPC .... H05K 1/0281; H05K 1/0346; H05K 1/189; H05K 3/0014; H05K 2201/0154; H05K 2201/10106
See application file for complete search history.

(56) References Cited

U.S. PATENT DOCUMENTS 5,600,179 A 2/1997 Suzuki
8,071,882 B2* 12/2011 Okajima ................ H05K 1/028
174/250

(Continued)

FOREIGN PATENT DOCUMENTS

CN 106813129 A 6/2017
EP 1247690 A2 10/2002
(Continued)

*Primary Examiner* — Nathan Milakovich

(57) ABSTRACT

The invention provides a printed circuit board assembly (1) comprising (i) an at least partly folded flexible printed circuit board (100), and (ii) an at least partly folded support (200), wherein: —the at least partly folded flexible printed circuit board (100) comprises a first PCB region (110) and a second PCB region (120), wherein at least part of the second PCB region (120) is configured folded over at least part of the first PCB region (110); —the at least partly folded support (200) is configured to support at least part of the at least partly folded flexible printed circuit board (100), wherein the at least partly folded support (200) comprises a first support region (210) and a second support region (220), wherein at least part of the second support region (220) is configured folded over at least part of the first support region (210), wherein at least part of the at least partly folded flexible printed circuit board (100) is configured between the first support region (210) and the second support region (220), and wherein the at least partly folded support (200) is configured to maintain the at least partly folded flexible printed circuit board (100) folded.

15 Claims, 1 Drawing Sheet

(51) Int. Cl.
*H05K 1/18* (2006.01)
*H05K 3/00* (2006.01)

(52) U.S. Cl.
CPC ... *H05K 3/0014* (2013.01); *H05K 2201/0154* (2013.01); *H05K 2201/10106* (2013.01)

(56) References Cited

U.S. PATENT DOCUMENTS

| | | |
|---|---|---|
| 2015/0282304 A1 | 10/2015 | Ely et al. |
| 2016/0025311 A1* | 1/2016 | Tischler .................. H01L 33/62 29/829 |
| 2017/0241624 A1 | 8/2017 | Badia |
| 2019/0029116 A1* | 1/2019 | Carel ..................... H05K 1/141 |
| 2021/0051801 A1* | 2/2021 | Chuah .................... H05K 1/181 |

FOREIGN PATENT DOCUMENTS

| | | |
|---|---|---|
| JP | 2014072331 A1 | 4/2014 |
| JP | 2017028034 A | 2/2017 |

* cited by examiner

FLEXIBLE PRINTED CIRCUIT BOARD ASSEMBLY

CROSS-REFERENCE TO PRIOR APPLICATIONS

This application is the U.S. National Phase application under 35 U.S.C. § 371 of International Application No. PCT/EP2020/055540, filed on Mar. 3, 2020, which claims the benefit of European Patent Application No. 19160784.5, filed on Mar. 5, 2019. These applications are hereby incorporated by reference herein.

FIELD OF THE INVENTION

The invention relates to a printed circuit board assembly, a module comprising such printed circuit board assembly, as well as to a functional unit comprising such printed circuit board assembly. The invention further relates to a method of producing the printed circuit board assembly.

BACKGROUND OF THE INVENTION

Flexible printed circuit boards are known in the art. US2017/0241624, for instance, describes a luminous module for an automotive vehicle, comprising: a metal device representing the ground, and an assembly comprising a flexible printed circuit board accommodating an electronic circuit, and at least one support plate, the assembly being placed on a surface of the metal device, wherein the flexible board comprises: a first board section that bears on a first face at least one electronic component of the electronic circuit, and that makes contact, via a second face that is opposite the first face, with said support plate so that the first board section is rigidified, characterized in that the flexible board comprises a second board section that comprises at least one electrically conductive track on a first face, and that is bounded by a single fold with respect to the first board section, the fold being such that the second board section makes contact with said support plate and such that the electrically conductive track forms a connection to ground.

SUMMARY OF THE INVENTION

In many commercial LED lighting products, LEDs require a substrate onto which they are soldered. The most common substrate is a printed circuit board (PCB) of the type of either composite epoxy material (CEMx), fiberglass reinforced epoxy (FRx) or metal core PCB (MC-PCB/IMS). A more recent trend is a flexible printed circuit board ("FPC"), which often comprises a cheap polyimide film in the lighting industry. These FPCs may be joined with a rigid substrate in order to provide a so-called L2 module construction that can more easily be integrated with a luminaire, comparable to such a module constructed with a rigid substrate.

The main embodiments for such L2 modules that are known at present all seem to use a metal substrate, usually extruded aluminum, or aluminum punched from plate or roll, although other rigid materials could theoretically be used as well. These assemblies are made along roughly two process sequences. In the first process sequence, the rigid substrate is first assembled with the FPC, by means of glue. This process uses a curing step under compression, so the substrate has to be flat and the SMT assembly ("surface-mount technology", a technology for mounting a surface-mounted device such as the LED on the surface of the PCB) with the LEDs has to happen afterwards. The result is very similar to a standard PCB and it offers limited opportunity to lower the cost below the levels of the conventional substrates. In the second sequence, the LEDs are assembled onto the FPC multiboard in an SMT process. The FPC multiboard is singulated into single flexible LED strips. These are assembled with a rigid substrate afterwards for which in most cases double-sided pressure sensitive adhesive is used. The assembly can be done either with a flat rigid substrate, or with a formed substrate such as e.g. extruded or stamped aluminum. The use of a shaped substrate can offer added functionality such as increased rigidity, or the possibility to locally clinch or clamp the FPC.

The most common (polyimide) FPCs, have a low tracking index (indicated by a comparative tracking index "CTI" and a proof tracking index "PTI") which may require large creepage distances, especially in case the module requires a high voltage functionality. This increases size and cost of the module.

The use of a shaped substrate increases opportunities to add functionality or decrease cost, but the use of pressure sensitive adhesive has a few drawbacks. Pressure sensitive adhesive is for instance not considered a guaranteed permanent connection which makes approbation difficult. Pressure sensitive adhesive is sensitive to permanent strain (consider strain transferred from a luminaire wire onto the module connector) and may get loose. Moreover, pressure sensitive adhesive ads to the cost of the module. Prices actually are of the same order as the FPC itself. As an alternative to pressure adhesion, the use of wet glue to assemble the FPC+LEDs onto a shaped substrate seems hardly explored yet. However, it is anticipated that problems may arise to apply the glue, to keep the glue away from the LEDS, and to cure the glue without applying pressure.

The use of aluminum for the rigid substrate is often preferred because of the better thermal conductivity. The substrate however also needs to provide features such as mechanical fixation, which require it to become larger. This may increase the cost of the substrate without making use of the thermal properties of aluminum.

Hence, it is an aspect of the invention to provide an alternative printed circuit board assembly, which preferably further at least partly obviates one or more of above-described drawbacks. In further aspects, the invention provides a module comprising the printed circuit board assembly, and a functional unit comprising the printed circuit board assembly, which preferably further at least partly obviate on or more of the above-described drawback. In a further aspect, the invention further provides a method for producing the printed circuit board assembly which preferably further at least partly obviates one or more of above-described drawbacks.

The present invention may have as object to overcome or ameliorate at least one of the disadvantages of the prior art, or to provide a useful alternative.

Therefore, in a first aspect the invention provides a printed circuit board ("PCB") assembly comprising an (at least partly) folded flexible printed circuit board. The assembly further especially comprises an (at least partly) folded support. The (at least partly folded) flexible printed circuit board comprises a first PCB region and a second PCB region, especially wherein at least part of the second PCB region is configured folded over at least part of the first PCB region.

The (at least partly) folded support is especially configured to support at least part of the (at least partly) folded flexible printed circuit board. The (at least partly) folded support may (therefore) comprise a first support region and a second support region, especially wherein at least part of the second support region is configured folded over at least part of the first support region. In embodiments, at least part of the (at least partly) folded printed circuit is configured between the first support region and the second support region. Moreover, the (at least partly) folded support may be configured to maintain the (at least partly) folded flexible printed circuit board folded.

The (at least part of the) first PCB region (configured folded over (at least part of) the second PCB region) and the (at least part of the) second PCB region may especially be configured parallel. The flexible PCB (also indicated herein as "FPC") is especially configured folded onto itself. As such the creepage distance (the shortest distance along a surface of the PCB (insulating material) between two conductive elements) may be increased (compared to prior art assemblies) without increasing the overall size of the assembly. Simultaneously, an increasing heat spreading without increasing the assembly size may be obtained. Moreover, the assembly (and module and functional unit of the invention) may especially allow application of higher voltages.

Furthermore, the combination of the this folded-over FPC with a thin support can be rolled or pressed into a shape after the assembly with the FPC in a way that makes the use of glue or pressure sensitive adhesive no longer necessary. The assembly may further be less sensitive to electrostatic discharge (ESD) than known assemblies may.

Yet a further advantage of the invention is the split of the functionality of thermal spreading and mechanical features. The assembly of the flexible printed circuit board and a (clamping) support may be mounted at a second support made of a cheaper (but rigid) material and shaped in a way that allows easy assembly of the parts themselves as well as an easy final assembly within the functional unit, such as a luminaire.

Hence, a specific aspect of the invention is the folding over of the flexible PCB. The invention therefore also provides the (at least partly) folded flexible printed circuit board, per se, especially comprising the first PCB region and the second PCB region, wherein at least part of the second PCB region is configured folded over at least part of the first PCB region. The flexible printed circuit board may further especially comprise a functional component functionally coupled to the flexible printed circuit board (see further below).

Flexible PCB's are known to the skilled person. A flexible PCB may especially comprise an insulating base and conductive tracks/a conductive pattern provided at the base (optionally covered by a further insulating layer). The conductive tracks (or conductive pattern) especially have a mixed functionality of heat spreading and electrical connection. Based in the folded configuration, at least part of the conductive tracks may be arranged between the insulating base of (the at least part of) the second PCB region and the insulating base of (the at least part of) the first PCB region. Based on this configuration of the FPC, the creepage distance is increased while the conductive tracks can be configured extending almost over a complete length (and/or width) of the folded part of the FCP, providing an increased heat spreading via the conductive material without the need of a large printed circuit board assembly or module size.

The flexible printed circuit board may have any arbitrarily shape. In specific embodiments, the FPC may have an elongated shape. The FPC may thus have a longitudinal FPC axis. In embodiments, the FPC is especially folded over in a direction (substantially) perpendicular to the FPC axis.

Hence, an axis of the folded FPC and at least part of the axis of the FPC may coincide. The second PCB region may be configured at an extreme (end) of the FPC. The first PCB region may in embodiments be configured at the further extreme (end) of the FPC. In such configuration, the FPC is especially folded over at one extreme (along the FPC axis) of the FPC. In embodiments, substantially the entire second PCB region may be folded over the entire first PCB region. In embodiments, the flexible printed circuit board is folded once. In further embodiments, the flexible printed circuit board is folded twice. The FPC may be folded a plurality of times. Folding a plurality of times may in embodiments further increase the creepage distance and/or may help fixation of the FPC at the substrate.

Hence, in embodiments the at least partly folded flexible printed circuit board may comprise a stack of layers, especially wherein at least part of the second PCB region is configured folded several times over at least part of the PCB region. Especially, all layers (a layer comprising the at least part of the first PCB region and a plurality of layers comprising the at least part of the second PCB region folded over a plurality of times) are configured parallel to each other.

In further specific embodiments, the FPC is folded over (once or, e.g., a plurality of times) at both extremes (along the FPC axis) of the FPC. The flexible printed circuit board may therefore comprise two or a plurality of second PCB regions, especially arranged at two of the extremes (along the FPC axis) of the FPC. Additionally or alternatively, at least part of the plurality of second PCB regions may be arranged at the same extreme of the FPC. In further embodiments, the plurality of second PCB regions may be arranged at a plurality of locations especially at the extremes and/or outer edge of the FPC. For instance, three (or four) second PCB regions may be arranged at three (or four) locations distributed over the outer edge of the FPC. In specific embodiments, at least parts of the respective second PCB regions are configured folded over at least parts of the first PCB region.

Herein the term "the second PCB region" may (thus) in embodiments especially relate to a plurality of (different) second PCB regions.

Polyimide-based materials are commonly used for FPCs. The flexible printed circuit board may (also) especially comprise a polyimide-based flexible printed circuit board. The FPC may especially allow folding without breaking. The flexible printed circuit board may for instance have a thickness of at least 10 μm, such as at least 15 μm, especially at least 25 μm. In further embodiments, the thickness (of the FPC) is equal to or less than 400 μm, such as equal to or less than 300 μm, even more especially equal to or less than 200 μm. In embodiments, the thickness is equal to or less than 150 μm. Especially, a thickness as described above, especially in combination with the polyimide material may allow folding of the FPC, especially in a sharp crease. Herein, the thickness of the flexible printed circuit board may further be referred to with the term "first thickness". In embodiments, the flexible printed circuit board has a first thickness selected from the range of 10-250 μm, especially 15-200 μm, such as 15-150 μm.

The at least partly folded FPC is not necessarily folded over a total length of the (at least partly) folded FPC. In embodiments, the folded FPC may e.g. be folded over only 10% of said length. In further embodiments, at least 20 percent of a total length of the (at least partly) folded flexible printed circuit board is folded. In further embodiments, at least 50 percent of the total length of the folded FPC is folded, such as at least 75 percent, or almost 100 percent the total length of the (at least partly) folded FPC. Herein, the percentages of the total length that is folded may especially relate to the percentage of the total length of the at least partly folded flexible printed circuit board wherein the first PCB region(s) is folded over the second PCB region. Hence, if almost 100 percent of the total length of the folded FPC is folded, this may imply that the second PCB region(s) is (are) configured substantially completely facing the entire first PCB region. It may especially relate to a configuration wherein the folded flexible printed circuit board comprises at least a double layer (of the second PCB region folded over the first PCB region) over substantially the total length of the folded FCB. As such, the total length of the folded flexible printed circuit board is about half of the total length of the flexible printed circuit board (before being folding). A total length of the second PCB region(s) (together) may in specific embodiments be about the same as a total length of the first PCB region (along the FPC axis). It will be understood that in embodiments comprising the second PCB region folded over the first PCB region a plurality of times, the total length of the second PCB region(s) (together) may be larger than the total length of the first PCB region, and especially also the total length of the folded flexible printed circuit board may be smaller than half of the total length of the (unfolded) flexible printed circuit board.

Folding the FPC at a location of a conductive track may in embodiments be undesirable. Hence, the conductive tracks may especially be configured (only) at the first PCB region. However, in further embodiments, also the second PCB region may comprise the conductive tracks. As such, heat spreading may further be improved. In specific embodiments, a conductive track configured at (the at least part of) the second PCB region that is configured folded over (the at least part of) the first PCB region may especially be configured for being provided with a same potential (voltage) as a track at the first PCB region it may face. Especially, facing tracks are configured for being provided with a substantially same potential.

In further embodiments, the FPC may comprise a functional component, especially functionally coupled to the FPC. The functional component may for instance comprise a light source, a sensor, or, e.g., an actuator, etc. In embodiments, the functional component comprises a solid state light source, such as an LED (light emitting diode). The terms "functional component", "light source", "solid state light source", etc. may especially relate to a plurality of (different) functional components, (solid state) light sources, etc., respectively. The flexible printed circuit board especially comprises a plurality of functional components. In an embodiment, the flexible printed circuit board comprises an array of solid state light sources, such as an array of LEDs. The solid state light source(s) emits solid state light source light. Preferably less than 20% of the solid state light source light is blocked by the at least partly folded flexible printed circuit board and/or the at least partly folded support. More preferably, less than 10% of the solid state light source light is blocked by the at least partly folded flexible printed circuit board and/or the at least partly folded support. Most preferably, less than 5% of the solid state light source light is blocked by the at least partly folded flexible printed circuit board and/or the at least partly folded support.

In further embodiments, the printed circuit board may comprise a solid state lighting light emitting arrangement or may be a solid state lighting light emitting arrangement.

In further embodiments, the solid state light source(s) emits solid state light source light. The solid state light source light is preferably white light. The white light has preferably a color temperature in the range from 2000 to 8000 K. The white light has preferably a color rendering index (CRI) of at least 80.

In further embodiments, the functional component may be configured at the first PCB region, and wherein at least part of the first PCB region and at least part of the second PCB region are configured parallel.

In further embodiments, the functional component may be configured at the first PCB region, and wherein at least part of the first PCB region and at least part of the second PCB region are configured parallel, and in such a manner that at least two surface segments of the at least partly folded flexible PCB, particularly at least two surface segments of the same surface of the at least partly folded flexible PCB, are in thermal and/or mechanical contact with one another.

In further embodiments, at least part of the first support region and at least part of the second support region may be configured parallel.

In further embodiments, the at least partly folded flexible printed circuit board may be configured folded onto itself.

In further embodiments, the at least partly folded flexible PCB has a first major PCB surface and a second major PCB surface, opposite to said first major PCB surface, and the functional component may be arranged on a first major surface of the at least partly folded flexible PCB. Preferably, the at least part of the first support region and at least part of the second support region may be configured parallel. Preferably, at least part of the first major PCB surface may face another part of the first major PCB surface.

In further embodiments, the at least partly folded flexible PCB may be provided with a fold. Preferably, the at least partly folded flexible PCB may be provided with a fold in such a manner that at least two surface segments of the at least partly folded flexible PCB, particularly at least two surface segments of the same surface of the at least partly folded flexible PCB, are brought into contact with one another.

In further embodiments, the at least partially folded flexible printed circuit board may comprise one or a plurality of (sharp) PCB folding line(s). The (sharp) PCB folding line(s) may divide the at least partially folded flexible printed circuit board into a first PCB region and a (plurality of) second PCB region(s).

In further embodiments, the at least partially folded support may comprise one or a plurality of (sharp) support folding line(s). The (sharp) support folding line(s) may divide the at least partially folded support into a first support region and a (plurality of) second support region(s).

In further embodiments, the (average) distance between first PCB region and the second PCB region may be less than 5 mm, especially les than 3 mm such as for example 1 or 0.1 mm. The obtained effect is a compact PCB assembly.

In further embodiments, the (solid state) light source may be in thermal contact (via (the first PCB region of) the at least partly folded flexible printed circuit board) to the (first support region) at least partly folded support.

In further embodiments, the (solid state) light source may be in thermal contact (via (the first PCB region of) the at least partly folded flexible printed circuit board) (and via (first support region) the at least partly folded support) to the assembly support. In further embodiments, the functional component is configured at the first PCB region and is a solid state light source.

The functional component may especially be functionally connected to a conductive track of the flexible printed circuit board, and may be connected to a further electrical component via the conductive track. The functional component may e.g. be connected to electrical periphery, such as a power supply, a driver, a transformer, etc., via the conductive track. The electrical periphery may especially be arranged external from the flexible printed circuit board. Hence, the FPC may further comprise connectors for connecting to the electrical periphery. These connectors, e.g., may be arranged at one or more of the extremities of the folded FPC. Moreover, the FPC may in embodiments comprise a connector end, known in the art. The FPC connector end may in embodiments be connected to a further connector configured at an assembly support (see further below), for instance using ZIF connector types or edge card connector types.

The functional component is in embodiments configured at the first PCB region (and especially functionally connected to one of the conductive tracks). The functional component is especially at least partly not covered by the flexible printed circuit board. Moreover, in further embodiments, the functional component is also at least partly not covered by the support (especially not by the second support region). In embodiments, the second PCB region is not (configured) folded over a location of the first PCB region comprising the functional component. In further embodiments, the second PCB region comprises an opening, which may be arranged over the functional component (when being folded over the location of the first PCB region comprising the functional component). The opening, e.g., may comprise a through hole or a recess in an edge (of the flexible printed circuit board, especially in the second PCB region).

Hence, in embodiments, the flexible printed circuit board, especially the second PCB region, comprises an opening configured over the functional component. The functional component is especially at least partly not covered by the flexible printed circuit board ((n)or by the support). Such opening especially in the FPC, may further advantageously be used during the method of producing the assembly. The combination of the functional unit and the opening may e.g. facilitate some automatic alignment of the second PCB region on the first PCB region during folding (see further below). The term "an opening" may relate to a plurality of (different) openings. The flexible printed circuit board may especially comprise a plurality of (different) openings configured for being arranged over a plurality of functional components, such as over an array of LEDs.

The at least partly folded flexible printed circuit board may in specific embodiments be attached to a support as discussed above, e.g. by means of glue, tape or other connection elements like screws. Yet, in specific embodiments, the at least partly folded flexible printed circuit board is clamped to the support, especially further reducing costs.

Hence, in embodiments the (at least partly folded) flexible printed circuit board is configured in combination with the (at least partly folded) support for providing the printed circuit board assembly. The support is especially configured clamping the folded circuit board. The FCP and the support may especially be configured alike, especially at least partly congruent. Moreover, in embodiments the at least partly folded support is configured to support at least part of the FPC. Furthermore, especially at least part of the second support region is configured folded over at least part of the first support region of the support wherein at least part of the at least partly folded flexible printed circuit board is configured between the first support region and the second support region. Because of such configuration, the support may hold (or fixate) the flexible PCB (between the first support region and the second support region). The at least partly folded support may maintain the at least partly folded FPC folded at a constant position.

The at least partly folded support is further especially configured to maintain the at least partly folded flexible printed circuit board folded. Based on this configuration, the folded FPC is especially prevented from translating along the axis of the FPC. The FPC is especially configured immobile relative to the support in the assembly. Yet, in embodiments, the FPC may (still) (only) translate in a direction perpendicular (or transverse) to the axis of the FPC. In other embodiments, the support and the FPC may (both) be folded in a direction parallel to the longitudinal axis of the PCB (or traverse to said axis). Therefore, in specific embodiments, the FPC may (optionally) translate in a direction parallel to the FPC axis, or even transverse to the axis of the FPC. In further embodiments, the flexible printed circuit board is fixated in the printed circuit board assembly.

To further minimize a movement of the FPC relative to the support, the support and the FPC may be folded at a plurality, such as two (especially opposite), locations of the FPC (and the support). Hence, in embodiments, the support comprises a plurality of second support regions. Especially each of the second support regions is (also) configured at an extreme or at the outer edge of the support. At least parts the respective second support regions may be configured folded over at least parts of the first support region, wherein at least part of the at least partly folded flexible printed circuit board is configured between the first support region and the second support regions.

Herein the term "the second support region" may therefore also refer to a plurality of second support regions.

In specific embodiments, the second support region further may provide an optical function. The second support region may, e.g., be reflective. The second support region may comprise a minimal reflectivity (ratio of the radiation flux reflected by a surface to the incident radiation flux) of at least 80%, especially at least 85%, such as at least 90%.

To allow folding of the support, the support may especially comprise a plastic deformable material. Especially, a plastic deformable material may be formed in a specific shape during processing and successively maintain in that shape. Hence, the deformable material of the support may be folded and successively may be used to clamp or fixate the flexible printed circuit board. The plastic deformable material may especially be selected for allowing it to press or role into a shape such that it may clamp the second PCB part and the first PCB part together. The plastic deformable material is further especially selected to be thermally conductive, to allow heat spreading. In embodiments, the deformable material is selected to have a thermal conductivity of at least 200 $W \cdot m^{-1} \cdot K^{-}$, such as at least 250 $W \cdot m^{-1} \cdot K^{-}$, especially at least 300 $W \cdot m^{-1} \cdot K^{-}$. The support may in embodiments comprise aluminum. In alternative embodiments, the support comprises copper. The support may further especially have a (second) thickness of the support (perpendicular to the length the support) equal to or larger than 50 µm, such as equal to or larger than 75 µm, especially equal to or larger than 100 µm. The second thickness is especially smaller than 2 mm, such as smaller than 1 mm. The second thickness may e.g. be equal to or smaller than 750 µm, especially equal to or smaller than 500 µm. The second thickness is especially selected from the range of 100-500 µm. The ranges of the second thickness as described herein may provide the preferred flexibility to clamp the flexible printed circuit board. It may further allow plastic deformation without breaking. For costs saving reasons it may especially not be thicker than described herein. The thickness of the support is herein especially referred to as "second thickness" to differentiate from the first thickness of the flexible printed circuit board.

The printed circuit board is especially configured for easily mounting in an assembly support. The assembly support may be comprised by a functional unit described herein. Additionally or alternatively, a combination of the printed circuit board and the assembly support may be mounted in the functional unit.

The printed circuit board assembly and the assembly support may in embodiments comprise complementary fastening elements configured for mounting the printed circuit board assembly at the assembly support. The fastening elements may especially be configured for fastening the printed circuit board assembly to the assembly support. In further embodiments, the assembly support may be configured for slidingly connecting the printed circuit board assembly to the assembly support or to clinch the printed circuit board to the assembly support. The assembly support may in yet further embodiments comprise fastening elements configured for slidingly and/or rotatably accepting the printed circuit board assembly. The printed circuit board assembly may especially comprise a thread or a sliding element to connect with the fastening elements of the assembly support. The assembly support is especially configured for hosting the printed circuit board and for coupling the printed circuit board to the assembly support.

In specific embodiments, the assembly support comprises resilient elements for (reversibly) mounting the printed circuit board at the assembly support. The resilient elements may e.g. comprise spring elements and/or a clip fastener. The assembly support is, especially the resilient elements are, especially configured for fixating the printed circuit board assembly to the assembly support, especially to a support region of the assembly support.

Therefore, the invention further provides a module comprising the printed circuit board assembly described herein and an assembly support. The assembly support comprises a support region and especially a plurality of resilient elements. The support region (alone) may in embodiments define a host position for hosting the printed circuit board assembly. In further embodiments, the support region and the resilient elements (together) define the host position for hosting the printed circuit board assembly. In embodiments, the resilient elements are configured to keep the printed circuit board assembly and the assembly support together. The resilient element may especially be configured for providing a (resilient) force, forcing the printed circuit board against the assembly support, especially against the support region. In further embodiments, the resilient elements are configured to press the printed circuit board assembly against the assembly support region.

The assembly support may further be configured as a heat sink for heat generated at the printed circuit board assembly. Furthermore, the assembly support may be configured for providing firmness/rigidity to the module. In embodiments, the assembly support, e.g., comprises, especially is made of, steel. In further embodiments, the assembly support comprises, especially is made of, aluminum. In yet further embodiments, the assembly support comprises a plastic. The assembly support is especially made of a material that is cheaper than the material of the support. The assembly support is in embodiments fabricated from one single material. The assembly support may for instance be shaped by pressing, rolling, punching, extrusion, or e.g. injection molding. Embodiments of the assembly support thus may comprise a monolithic body. Hence, in a specific embodiment, the assembly support comprises steel and the assembly support is a monolithic body. The assembly support may further especially have an assembly support thickness equal to or larger than 100 µm, such as equal to or larger than 250 µm. The assembly support thickness may especially be smaller than 5 mm, such as smaller than 2 mm. The assembly support thickness may in embodiments be especially equal to or smaller than 1 mm. Yet, thicker assembly supports may also be applied.

The module and/or the assembly support may further be configured for mounting in a functional unit. Therefore, the module may further comprise a first mechanical fixation element for fixating to a second mechanical fixation element of a functional unit. In further embodiments, the assembly support may comprise the first mechanical fixation element for fixating to the second mechanical fixation element of the functional unit. The first mechanical fixation element and the second mechanical fixation element are especially complementary. The first mechanical fixation element may e.g., comprise an opening for receiving a second mechanical fixation element comprising a protrusion or a hook. The first and second mechanical fixation elements may further be configured for rotationally connecting, and e.g. together define a bayonet mount. Additionally or alternatively, the first mechanical fixation element and the second mechanical fixation element (both) comprise an opening configured for receiving a pin or a plug to connect or the first mechanical fixation element with the second mechanical fixation element. In further embodiments one of the first and the second mechanical fixation elements comprises a pin to click the respective fixation element to the other fixation element.

Herein the terms "first mechanical fixation element" and "second mechanical fixation element" may especially relate to a plurality of (different) (first and second) mechanical fixation elements.

In yet a further aspect, the invention provides a functional unit comprising a housing and the flexible printed circuit board. Especially, the functional unit comprises the housing and the printed circuit board assembly described herein. The functional unit may in embodiments comprise a lighting device. In further embodiments, the functional unit comprises a camera, or e.g. a medical device. The functional unit, especially the lighting device, may especially comprise a luminaire. In embodiments, the printed circuit board assembly comprises the solid state source described herein.

The housing is especially configured to shield the electronic conductive parts of the printed circuit board assembly. The printed circuit board assembly is especially (substantially completely) enclosed by the housing. Yet, in embodiments the housing may comprise an opening, e.g. for being able to reach the functional component. Especially, the printed circuit board assembly is at least partly enclosed by the housing.

As described above, a module described herein may comprise the assembly support and may as such be (directly) connected to a housing described herein, whereas in other embodiments the assembly support may be comprised by the housing, and a printed circuit board described herein may be connected to the assembly support of the housing.

Hence, in further embodiments, at least part of the housing is configured as the assembly support.

In further embodiments, the functional unit further comprises the second mechanical fixation element, especially wherein the second mechanical fixation element is functionally coupled to the housing. The second mechanical fixation element may be part of the housing. The second mechanical fixation element may also be indirectly coupled to the housing, e.g. during mounting the module in the housing.

The functional unit may thus especially comprise the module (comprising the first mechanical fixation element), wherein the first mechanical fixation element of the module and the second mechanical fixation element of the functional unit are configured to keep the module and the housing together.

In specific embodiments, the at least partly folded support, or at least the second support region may be part of the housing or may be defined by the housing. In embodiments, at least part of the housing is configured as the at least partly folded support, or at least the second support region. Moreover, at least part of the housing may be configured as the first support region. The at least partly folded support, especially the second support region, e.g., may be pressed in, or punched out, the housing and/or may be configured during forming such as pressing the housing. The first support region and the second support region may therefore be at least part of the housing or may define at least part of the housing.

Hence, in a specific embodiment, the invention provides the functional unit comprising the housing and the at least partly folded flexible printed circuit board, especially wherein the at least partly folded flexible printed circuit board comprises the first PCB region and the second PCB region, wherein at least part of the second PCB region is configured folded over at least part of the first PCB region. Especially, the housing may be configured to support at least part of the at least partly folded flexible printed circuit board, wherein the housing comprises the first support region and the second support region, wherein at least part of the second support region is configured folded over at least part of the first support region, wherein at least part of the at least partly folded flexible printed circuit board is configured between the first support region and the second support region, and wherein the housing is configured to maintain the at least partly folded flexible printed circuit board folded.

Especially, the flexible printed circuit board comprises the functional component functionally coupled to the flexible printed circuit board, especially wherein the functional component is at least partly not covered by the flexible printed circuit board or by the second support region. The flexible printed circuit board is especially at least partly enclosed by the housing.

In a further aspect, the invention further provides a method of producing a printed circuit board assembly, especially the printed circuit board assembly described herein. The method comprising: providing a flexible printed circuit board, and a support, wherein the flexible printed circuit board comprises a first PCB region and a second PCB region, and wherein the support comprises a first support region and a second support region, especially wherein the support comprises a plastic deformable material. The method, further, especially comprises a folding stage, wherein the folding stage especially comprises a PCB folding and a support folding.

According to embodiments, the method of producing the printed circuit board assembly further comprises functionally coupling a functional component to the at least partly folded flexible printed circuit board such that the functional component is not covered by the at least partly folded flexible printed circuit board and not by the at least partly folded support; and wherein the functional component is configured at the first PCB region and comprises a solid state light source.

The PCB folding especially comprises: folding at least part of the second PCB region over at least part of the first PCB region, to provide an at least partly folded flexible printed circuit board, especially wherein at least part of the first PCB region and at least part of the second PCB region are configured parallel. The support folding especially comprises: folding at least part of the second support region over at least part of the first support region, to provide an at least partly folded support, especially wherein at least part of the at least partly folded flexible printed circuit board is configured between the first support region and the second support region, and especially wherein at least part of the first support region and at least part of the second support region are configured parallel. In embodiments, the PCB folding may precede the support folding. In further embodiments, the support folding may be combined with the PCB folding. Especially, the support folding includes the PCB folding.

In further embodiments, the flexible printed circuit board comprises a plurality of second PCB regions, and especially the support (also) comprises a plurality of second support regions. Hence, in embodiments, the PCB folding may comprise folding at least part of the plurality of second PCB regions over at least part of the first PCB region (to provide the at least partly folded flexible printed circuit board, especially wherein at least part of the plurality of first PCB regions and at least part of the second PCB region are configured parallel. Moreover, in embodiments, the support folding stage may comprise folding at least part of the plurality of second support regions over at least part of the first support region, to provide the at least partly folded support, especially wherein at least part of the at least partly folded flexible printed circuit board is configured between the first support region and the second support region, and especially wherein at least part of the first support region and at least part of the second support region are configured parallel. The plurality of second support regions and the plurality of second PCB regions may in embodiments also be folded in sequential steps (of repeated PCB folding preceding support folding, or repeated support folding including PCB folding).

In embodiments, the (provided) at least partly folded support comprises a metal, especially aluminum plate. In further embodiments, the support comprises a metal, especially an aluminum, U-profile. Folding may especially comprise pressing and/or rolling. In a continuous assembly process, especially folding may comprise rolling. During the combined or successive folding, the FPC is at least partly clamped between the second support region and the first support region.

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, or LCD backlighting.

As indicated above, the lighting unit may be used as backlighting unit in an LCD display device. Hence, the invention provides also a LCD display device comprising the lighting unit as defined herein, configured as backlighting unit. The invention also provides in a further aspect a liquid crystal display device comprising a back lighting unit, wherein the back lighting unit comprises one or more lighting devices as defined herein.

Preferably, the light source is a light source that during operation emits (light source light) at least light at a wavelength selected from the range of 200-490 nm, especially a light source that during operation emits at least light at wavelength selected from the range of 400-490 nm, even more especially in the range of 440-490 nm. This light may partially be used by the wavelength converter nanoparticles (see further also below). Hence, in a specific embodiment, the light source is configured to generate blue light.

The term "light source" may refer to a semiconductor light-emitting device, such as a light emitting diode (LEDs), a resonant cavity light emitting diode (RCLED), a vertical cavity laser diode (VCSELs), an edge emitting laser, etc. The term "light source" may also refer to an organic light-emitting diode, such as a passive-matrix (PMOLED) or an active-matrix (AMOLED). In a specific embodiment, the light source comprises a solid state light source (such as a LED or laser diode). In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module. The term "light source" may also relate to a plurality of (essentially identical (or different)) light sources, such as 2-2000 solid state light sources. In embodiments, the light source may comprise one or more micro-optical elements (array of micro lenses) downstream of a single solid state light source, such as a LED, or downstream of a plurality of solid state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering).

The phrases "different light sources" or "a plurality of different light sources", and similar phrases, may in embodiments refer to a plurality of solid state light sources selected from at least two different bins. Likewise, the phrases "identical light sources" or "a plurality of same light sources", and similar phrases, may in embodiments refer to a plurality of solid state light sources selected from the same bin.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily to scale.

DETAILED DESCRIPTION OF THE EMBODIMENTS

Figure 1:
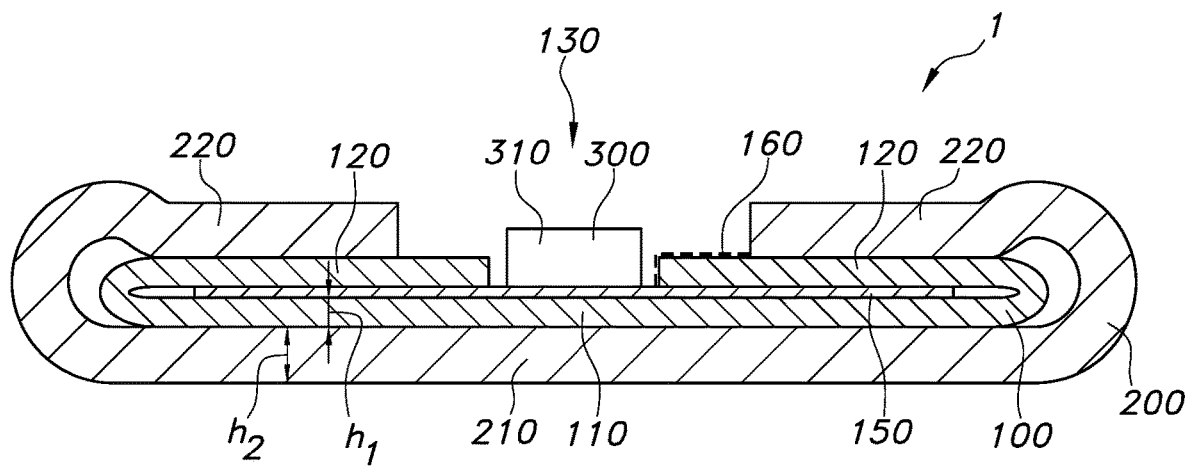
FIG. 1 schematically depicts an embodiment of the printed circuit board assembly of the invention.

FIG. 1 schematically depicts an embodiment of the printed circuit board assembly 1. The printed circuit board assembly 1 comprising an at least partly folded flexible printed circuit board 100 and an at least partly folded support 200. The at least partly folded flexible printed circuit board 100, herein also indicated as "FPC" 100, may especially be polyimide-based. The FCB comprises a first PCB region 110 and a second PCB region 120, wherein at least part of the second PCB region 120 is configured folded over at least part of the first PCB region 110. The assembly 1 may comprise exactly one first PCB region 110 folded over the second PCB region 120. The assembly 1 may also comprise a plurality of second PCB regions 120. The embodiment depicted in FIG. 1 e.g. comprises two second PCB regions 120; a first second PCB region 120 at the right hand side of the figure and a further second PCB region 120 at the left hand side of the figure; both being folded over the first PCB region 110. The second PCB regions 120 are especially configured at an extreme of the FPC 100. In embodiments (not depicted), only one of the extremes (or edges) comprises a second PCB region 120.

The at least partly folded support 200 is configured to support at least part of the at least partly folded flexible printed circuit board 100. The at least partly folded support 200 in FIG. 1 comprises a first support region 210 and two second support regions 220. At least a part of the second support regions 220 are (configured) folded over (at least part of) the first support region 210. As such (at least part of) the at least partly folded flexible printed circuit board 100 is configured between the first support region 210 and the second support regions 220. This way, the folded support 200 maintains the at least partly folded flexible printed circuit board 100 folded.

The embodiment in FIG. 1 further comprises a functional component 300, especially a solid state light source 310, functionally coupled to the flexible printed circuit board 100, especially to the conductive track 150 of the FPC 100. To not block any light source light emitted by the solid state light source 310, the functional component 300 is at least partly not covered by the flexible printed circuit board 100 or by the support 200. Therefore, flexible printed circuit board 100 comprises an opening 130 configured over the functional component 300.

In the figure, the first thickness h1 of the FPC 100 and the second thickness h2 of the support 200 are also depicted. In embodiments, the first thickness h1 is selected from the range of 15-200 μm. The second thickness h2 may especially be selected from the range of 100-500 μm. Furthermore, for producing the assembly 1, the support 200 may especially comprise a plastic deformable material comprising aluminum or copper.

The configuration of the printed circuit board assembly 1 may advantageously provide an increased creepage distance 160, being a shortest length over a surface of the FPC 100 connecting two conducting elements with each other. In FIG. 1, the creepage distance 160 is especially the distance between a conductive track 150 of the FPC 100 and the second support region 120. The creepage distance 160 would further be increased if the second support region 120 would not be conductive. The electrically conductive clamping support 200, though, further now may provide a shield around the solid state light source(s) 310 that offers increased protection against ESD (electrostatic discharge) damage by handling. Hence, by folding the second PCB region 120 over the first PCB region, the conductive track 150 is shielded to a larger extend compared to unfolded flexible printed circuit boards, and the creepage distance 160 is extended. At the same time, the conductive tracks 150 of the FPC 100 may be extended further from the solid state light source 310 (closer to the support 200) thereby enlarging the heat spreading capacity of the FPC 100.

The printed circuit board assembly 1 may be produced with the method (of the invention) of producing the printed circuit board assembly 1. In the method, a flexible printed circuit board 100 and a support 200 are provided, especially wherein the support 200 comprises a plastic deformable material. The flexible printed circuit board 100 may comprise a first PCB region 110 and a (at least one) second PCB region 120, and the support 200 especially comprises a first support region 210 and a (at least one) second support region 220. The method further comprises a folding of the flexible printed circuit board 100 and a folding of the support 200.

During the PCB folding at least part of the second PCB region 120 is folded over at least part of the first PCB region 110, to provide an at least partly folded flexible printed circuit board 100. During the support folding at least part of the second support region 220 is folded over at least part of the first support region 210, to provide an at least partly folded support 200, wherein at least part of the at least partly folded flexible printed circuit board 100 is configured between the first support region 210 and the second support region 220. In embodiments, first the PCB 100 is folded and next the support 200 may be folded. Yet, in specific embodiments, folding of the support 200 and the PCB 100 is performed simultaneously.

As depicted in FIG. 1, the functional component 300 is configured at the first PCB region 110, and wherein at least part of the first PCB region 110 and at least part of the second PCB region 120 are configured parallel.

As depicted in FIG. 1, the at least partly folded flexible printed circuit board 100 is configured folded onto itself.

As depicted in FIG. 1, at least partly folded flexible PCB 100 has a first major PCB surface and a second major PCB surface, opposite to said first major PCB surface. The functional component 300 is arranged on a first major surface of the at least partly folded flexible PCB 100.

As depicted in FIG. 1, the (solid state) light source 310 may be in thermal contact via the first PCB region 110 of the at least partly folded flexible printed circuit board 100 to the first support region 210 of at least partly folded support 200.

As depicted in FIG. 1, In further embodiments, the (solid state) light source 310 may be in thermal contact via first PCB region 110 of the at least partly folded flexible printed circuit board 100 and via the first support region 210 of the at least partly folded support 200 to the assembly support 400.

Figure 2:
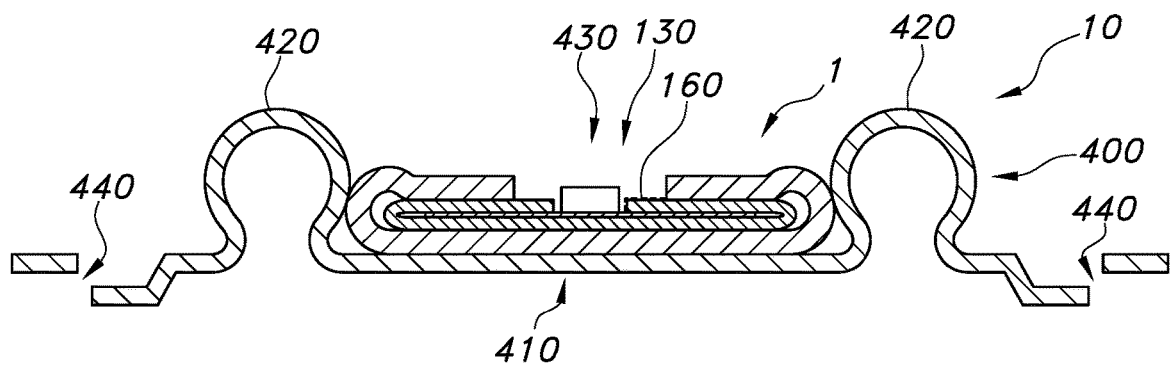
FIG. 2 schematically depicts and embodiment of the module.

In FIG. 2, an embodiment of a module 10 according to the invention is depicted. The module 10 comprises the printed circuit board assembly 1 depicted in FIG. 1 and an assembly support 400. The depicted assembly support 400 comprises a support region 410 and a plurality of resilient elements 420, together defining a host position 430 for hosting the printed circuit board assembly 1. The resilient elements 420 (are configured to) press the printed circuit board assembly 1 at the assembly support 400.

The assembly support 400 may in embodiments comprise steel or another metal especially providing a heat sink function to the module. The assembly support 400 is especially made out of one piece (raw) material and may be a monolithic body.

Furthermore, in the module 10 especially the printed circuit board assembly 1 may provide a first step towards heat spreading, while minimizing the use of the more expensive materials like aluminum. The assembly support 400 may provide further heat conduction as well as added functionality.

FIG. 2 further schematically depicts two first mechanical fixation elements 440 of the module 10. In the depicted embodiment, the first mechanical fixation elements 440 comprise an opening or punch-out. As such, the first mechanical fixation elements may e.g. be fixated to second mechanical fixation element 1040 of a functional unit 1000 (see FIG. 3), e.g., comprising protruding, especially spring like, elements that may match with the openings of the first mechanical fixation elements 440.

Figure 3:
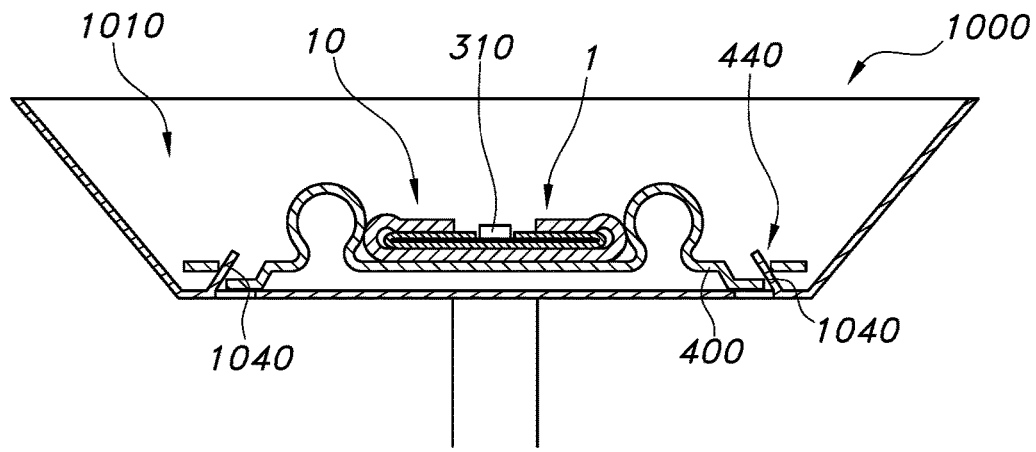
FIG. 3 schematically depicts a functional unit according to the invention.

FIG. 3 schematically depicts an embodiment of a functional unit 1000 described herein. The functional unit 1000 comprises a housing 1010 and the printed circuit board assembly 1. In the depicted embodiment, the functional unit 1000 comprises a luminaire and the printed circuit board assembly 1 comprises a solid state source 310. The housing 1010 especially at least partly encloses the printed circuit board assembly 1.

In embodiments, the printed circuit board assembly 1 as depicted e.g. in FIG. 1 may be coupled to the housing 1010 of the functional unit 1000. Hence, the housing may comprise the assembly support 400. Especially, at least part of the housing 1010 may thus be configured as the assembly support 400. In further embodiments, the module 10 as e.g. depicted in FIG. 2 may be coupled to the housing 1010 of the functional unit 1000. In such embodiment, the functional unit 1000 further especially comprises the second mechanical fixation element 1040, wherein the second mechanical fixation element 1040 is functionally coupled to the housing 1010. In FIG. 3 schematically a pair of second mechanical fixation elements 1040 are depicted comprising plugs or clickable elements connected to the housing 100 and matching the first mechanical fixation 440 of the module 10. Hence, the first mechanical fixation elements 440 of the module 10 and the second mechanical fixation elements 1040 of the functional unit 1000 are configured to keep the module 10 and the housing 1010 together.

The term "plurality" refers to two or more. The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" includes also embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

What is claimed is:

1. A printed circuit board assembly comprising (i) an at least partly folded flexible printed circuit board, and (ii) an at least partly folded support, wherein:
   the at least partly folded flexible printed circuit board comprises a first PCB region and a second PCB region, wherein at least part of the second PCB region is configured folded over at least part of the first PCB region;
   the at least partly folded support is configured to support at least part of the at least partly folded flexible printed circuit board, wherein the at least partly folded support comprises a first support region and a second support region, wherein at least part of the second support region is configured folded over at least part of the first support region, wherein at least part of the at least partly folded flexible printed circuit board is configured between the first support region and the second support region, and wherein the at least partly folded support is configured to maintain the at least partly folded flexible printed circuit board folded,
   the printed circuit board assembly further comprising a functional component functionally coupled to the at least partly folded flexible printed circuit board, wherein the functional component is not covered by the at least partly folded flexible printed circuit board and not by the at least partly folded support,
   wherein the functional component is configured at the first PCB region and is a solid state light source.

2. The printed circuit board assembly according to claim 1, wherein at least part of the first PCB region and at least part of the second PCB region (120) are configured parallel.

3. The printed circuit board assembly according to claim 2, wherein the at least partly folded flexible printed circuit board is configured folded onto itself.

4. The printed circuit board assembly according to claim 2, wherein the flexible printed circuit board comprises an opening configured over the functional component.

5. The printed circuit board assembly according to claim 1, wherein the flexible printed circuit board comprises a polyimide-based flexible printed circuit board, and wherein the flexible printed circuit board has a first thickness selected from the range of 15-200 µm.

6. The printed circuit board assembly according to claim 1, wherein the support has a second thickness selected from the range of 100-500 µm, wherein the support comprises a plastic deformable material, and wherein the support comprises aluminum or copper.

7. The printed circuit board assembly according to claim 1, wherein the flexible printed circuit board comprises a plurality of second PCB regions, wherein at least parts of the respective second PCB regions are configured folded over at least parts of the first PCB region.

8. The printed circuit board assembly according to claim 1, wherein the support comprises a plurality of second support regions, wherein at least parts the respective second support regions are configured folded over at least parts of the first support region, and wherein at least part of the at least partly folded flexible printed circuit board is configured between the first support region and the second support regions.

9. A module comprising (i) the printed circuit board assembly claim 1, and (ii) an assembly support, wherein:
   the assembly support comprises a support region and a plurality of resilient elements, wherein the support region and the resilient elements define a host position for hosting the printed circuit board assembly, and wherein the resilient elements are configured to keep the printed circuit board assembly and the assembly support together.

10. The module according to claim 9, wherein the resilient elements are configured to press the printed circuit board assembly against the assembly support region, wherein the assembly support comprises steel, and wherein the assembly support is a monolithic body.

11. The module according to claim 9, further comprising a first mechanical fixation element for fixating to a second mechanical fixation element of a functional unit.

12. The functional unit according to claim 11, wherein the second mechanical fixation element is functionally coupled to the housing, wherein the functional unit comprises the module, and wherein the first mechanical fixation element of the module and the second mechanical fixation element of the functional unit are configured to keep the module and the housing together.

13. A functional unit comprising (i) a housing and (ii) the printed circuit board assembly according to claim 1, wherein the printed circuit board assembly is at least partly enclosed by the housing, and wherein the functional unit comprises a luminaire.

14. The functional unit according to claim 13, wherein at least part of the housing is configured as the assembly support.

15. A method of producing a printed circuit board assembly, the method comprising:
   providing (i) a flexible printed circuit board, and (ii) a support, wherein the flexible printed circuit board comprises a first PCB region and a second PCB region, and wherein the support comprises a first support region and a second support region, wherein the support comprises a deformable material;
   a folding stage comprising:
      a PCB folding comprising folding at least part of the second PCB region over at least part of the first PCB region, to provide an at least partly folded flexible printed circuit board; and
      a support folding comprising folding at least part of the second support region over at least part of the first support region, to provide an at least partly folded support, wherein at least part of the at least partly folded flexible printed circuit board is configured between the first support region and the second support region; wherein the PCB folding precedes the support folding or wherein the support folding includes the PCB folding;
   functionally coupling a functional component to the at least partly folded flexible printed circuit board such that the functional component is not covered by the at least partly folded flexible printed circuit board and not by the at least partly folded support; and
   wherein the functional component is configured at the first PCB region and comprises a solid state light source.

* * * * *